United States Patent
Lee et al.

(10) Patent No.: US 7,092,270 B2
(45) Date of Patent: Aug. 15, 2006

(54) APPARATUS AND METHOD FOR DETECTING MULTIPLE HITS IN CAM ARRAYS

(75) Inventors: Michael Ju Hyeok Lee, Austin, TX (US); Sheldon B. Levenstein, Austin, TX (US); Edelmar Seewann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/880,719

(22) Filed: Jun. 30, 2004

(65) Prior Publication Data

US 2006/0002163 A1 Jan. 5, 2006

(51) Int. Cl.
*G11C 15/00* (2006.01)

(52) U.S. Cl. .......................... 365/49; 365/190
(58) Field of Classification Search .................. 365/49, 365/190
See application file for complete search history.

(56) References Cited

U.S. PATENT DOCUMENTS

| | | | | |
|---|---|---|---|---|
| 5,113,507 A | * | 5/1992 | Jaeckel | 711/5 |
| 6,597,595 B1 | * | 7/2003 | Ichiriu et al. | 365/49 |
| 6,647,457 B1 | * | 11/2003 | Sywyk et al. | 711/108 |
| 6,728,124 B1 | * | 4/2004 | Ichiriu et al. | 365/49 |
| 6,892,272 B1 | * | 5/2005 | Srinivasan et al. | 711/108 |

* cited by examiner

*Primary Examiner*—Michael Tran
(74) *Attorney, Agent, or Firm*—Duke W. Yee; Thomas E. Tyson; Cathrine K. Kinslow

(57) ABSTRACT

An apparatus and method are disclosed for detecting multiple hits in CAM arrays. A binary address value is stored for each entry of the CAM array and is output to identify the matching entry for a single hit. However, to facilitate multiple hit detection, both the true and complement components of this address are stored and output to determine whether or not a multiple hit occurred. If a multiple hit occurs (e.g., more than one address location has been matched), all the bits that make up the binary address and the complement will not be complements of each other and a multiple hit condition can be detected by XORing each bit of an address location value with the complement of that address location value. If the XORed bits are equal to "1", then a single hit has occurred. Otherwise, a multiple hit has occurred.

20 Claims, 1 Drawing Sheet

APPARATUS AND METHOD FOR DETECTING MULTIPLE HITS IN CAM ARRAYS

BACKGROUND OF THE INVENTION

1. Technical Field

The present invention relates generally to improved memory storage for data processing systems, and in particular, but not exclusively, to an apparatus and method for detecting multiple hits in a Content Addressable Memory (CAM) array.

2. Description of Related Art

CAM, or associative memory, is a special type of memory storage device typically used for high speed searching applications. Each CAM device includes comparison logic, so that the contents of the bit positions can be compared within the device. In standard computer memory devices (e.g., DRAMs, SRAMs, etc.), their bits are addressed by memory location, and the contents of their bits are conveyed to an Arithmetic Logic Unit (ALU) outside of the memory device for comparison purposes.

A data word can be input to a CAM device, and the CAM device can search its entire memory for the input word. If the CAM device finds the word in its memory, the device returns a list with the storage address(es) of the memory location(s) where the word was found. As such, a CAM device can perform such a search of its entire memory in one operation. Consequently, a CAM device is significantly faster than a RAM device for most search applications.

All words that are input (e.g., entries) to a CAM device can be compared to the words stored in the device. However, at most, only one word stored in the device should match the entry. Nevertheless, a significant problem with existing CAM devices is that a circuit failure or software error external to the CAM device can cause the occurrence of so-called "multiple hits". If a multiple hit condition exists, multiple word-lines are enabled in the CAM device and erroneous outputs are returned. In such a case, it is important to be able to detect a multiple hit condition in a CAM device before such erroneous outputs can be returned. However, existing techniques for detecting multiple hit conditions in CAM devices incur substantial penalties in terms of space, because a relatively large number of gates are required to tap all of the word-lines in the device in order to determine if more than one word-line is enabled or turned on.

Therefore, it would be advantageous to have an apparatus and method for detecting multiple hit conditions in CAM devices that, at a minimum, do not incur substantial penalties in terms of space.

SUMMARY OF THE INVENTION

In accordance with a preferred embodiment of the present invention, true and complement address values are stored for each entry to a CAM array. The stored true and complement address location values for each entry are used to determine whether or not a multiple hit condition exists. The true and complement values of an address location can be read out and XORed. If there is a single hit with respect to that address location, then the address location of the matched entry can be output. However, if there is a multiple hit condition (e.g., more than one address location has been matched), all of the bits that makeup the binary address value and the complementary address value are not complements of each other. Therefore, a multiple hit condition can be detected by XORing each bit of an output address location value with the complement of that address location value. In this regard, if the XORed bits are equal to "1", then a single hit has occurred. Otherwise, if the XORed bits are not equal to "1", then a multiple hit has occurred (e.g., more than one address has been matched).

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
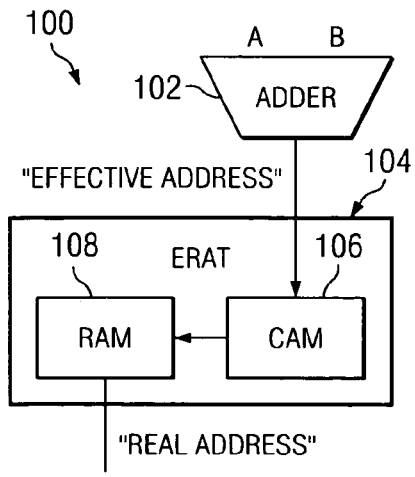
FIG. 1 is a pictorial representation of a subsection of a Load/Store Unit of a VLSI microprocessor.

FIG. 1 shows a subsection of a Load/Store unit (LSU) of a VLSI microprocessor. LSU 100 is responsible for loading old data from memory into the processor and storing newly computed data back into memory. The relevant subsection depicted in FIG. 1 consists of adder 102 which computes an "effective address" of memory. This address is presented to Effective to Real Address Translation unit (ERAT) 104 which consists of Content Addressable Memory (CAM) 106 and RAM 108. The effective address is presented to CAM 106 and all entries are searched simultaneously for an entry matching the effective address presented at its inputs. If a single match is found (a hit), the word address for the matching entry is output as the "hit address" and the same word address is immediately converted into a word line address for RAM 108 within ERAT 104. This word line is used to access RAM 108 within ERAT 104. The word stored in RAM 108 is "real address" which is then used to access memory. If the effective address misses (no hit) in CAM 106, a new pair of effective and real addresses will subsequently be written in ERAT 104.

If more than one entry is matched, this is indicative of a rarely occurring software error and a recovery mechanism must be started since the "real address" will have been corrupted due to multiple word lines becoming active in RAM 108. To start this recovery procedure, a "multiple hit" detect mechanism is required.

Figure 2:
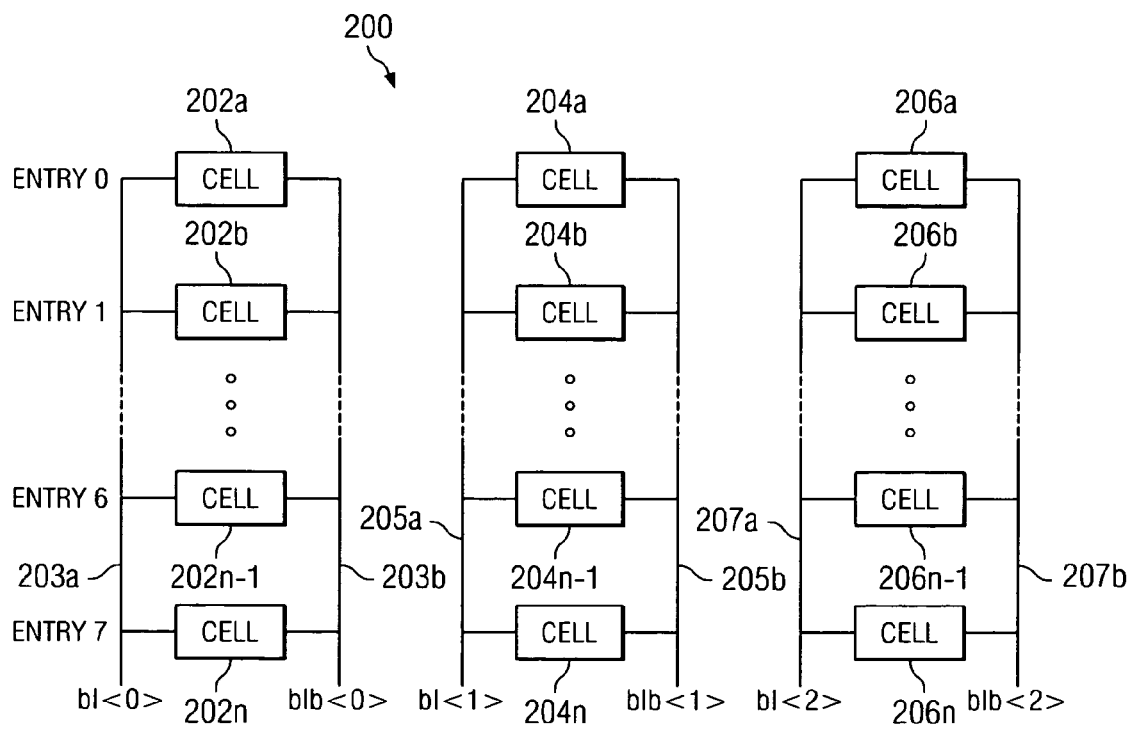
FIG. 2 is a diagram depicting an exemplary CAM, in accordance with a preferred embodiment of the present invention.

Referring now to FIG. 2, a diagram illustrating an exemplary CAM structure is depicted in accordance with a preferred embodiment of the present invention. For this illustrative example, CAM 200 is structured as an array. However, the type of structure depicted in FIG. 2 is not intended as an architectural limitation on the present invention, and the scope of the present invention can include any suitable memory structure. As such, CAM 200 includes a plurality of address cells (e.g., bits) 202*a*–202*n*, 204*a*–204*n* and 206*a*–206*n* preferably arranged as an array. For example, cells 202*a*–202*n* can form a first column of an array, cells 204*a*–204*n* can form a second column of the array, and cells 206*a*–206*n* can form a third column of the array. Thus, for this example, cells 202*a*, 204*a* and 206*a* can form a first row in the array, and it follows that cells 202n, 204n and 206n can form an nth row in the array. As such, CAM 200 is shown for illustrative purposes, with three columns and eight rows of address cells. However, it should be understood that the present invention is not intended to be so limited and can include CAM with more or less columns and/or more or less rows of cells than those shown in the example structure of FIG. 2.

For this exemplary embodiment, each entry 0–7 in CAM 200 stores the true and complement values of its address location. Each bit of the address is physically ORed with all of the other entries (e.g., represented by the vertically-oriented dots). CAM 200 in FIG. 2 illustrates such features for an array with 8 entries, whereby three cells are used to store the TRUE address values and the COMPLEMENT address values. In other words, each entry 0–7 represents a word-line composed of three bits (e.g., entry 0 is composed of cells 202a, 204a, 206a), and each entry 0–7 has a unique address (e.g., entry 0 can have an address "000", entry 1 can have an address "001", and so on to entry 7 with an address of "007").

Also, each address cell in CAM 200 is coupled to an associated pair of bit-lines. For example, each of cells 202a–202n is coupled to bit-line<0> 203a and bit-line bar<0> 203b. As such, bit-line<0> 203a represents the (ORed) TRUE address value for cells 202a–202n, and bit-line bar<0> 203b represents the (ORed) COMPLEMENT address value for those same cells. Thus, it follows that bit-line<1> 205a represents the TRUE address value for cells 204a–204n, and bit-line bar<2> 205b represents the COMPLEMENT address value for those same cells. Similarly, bit-line<2> 207a represents the TRUE address value for cells 206a–206n, and bit-line bar<2> 207b represents the COMPLEMENT address value for those same cells.

Essentially, in accordance with a preferred embodiment of the present invention, true and complement address values are stored for each entry to a CAM array. The stored true and complement address location values for each entry are used to determine whether or not a multiple hit condition has occurred. For example, entry 2 (e.g., in FIG. 2) can store the binary value of the address location "2", and entry 7 can store the binary value of the address location "7". In accordance with the present invention, the true and complement values of an address location can be read out and XORed. If there is a single hit with respect to that address location, then the address location of the entry that was matched can be output (i.e., the true address value and the complement address value of that location can be output). However, if there is a multiple hit (e.g., more than one address location has been matched), all of the bits that makeup the binary address value and the complementary address value are not complements of each other. Therefore, a multiple hit condition can be detected by XORing each bit of an output address location value with the complement of that address location value. In this regard, if all of the XORed bits are equal to "1", then a single hit has occurred. Otherwise, if all of the XORed bits are not equal to "1", then a multiple hit has occurred (e.g., more than one address has been matched).

Figure 3:
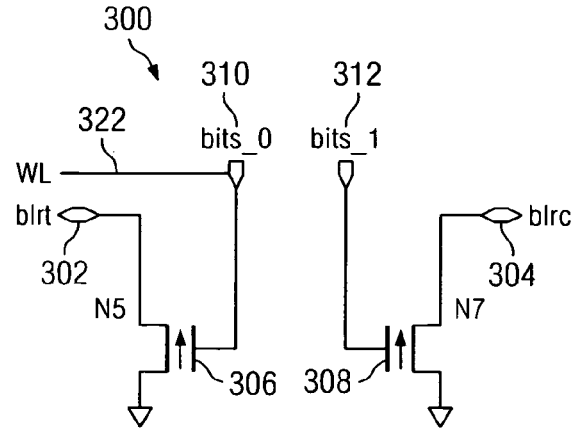
FIG. 3 is a diagram depicting an exemplary CAM address cell, in accordance with a preferred embodiment of the present invention.

Referring now to FIG. 3, a diagram illustrating an exemplary CAM address cell structure is depicted in accordance with a preferred embodiment of the present invention. For example, cell 300 shown in FIG. 5 can be used to implement any address cell 202a–202n, 204a–204n, and/or 206a–206n in FIG. 2. Also, for this exemplary embodiment, cell 300 is depicted as a RAM type of cell, but the present invention is not intended to be so limited and can include other types of non-permanent memory such as, for example, ROM, etc.

Essentially, as illustrated in and described above with respect to FIG. 2, the bit-lines for all entries 0–7 are preferably ORed together. Therefore, for this exemplary embodiment, cell 300 is configured as a single-ended, pull-down cell. As such, bit-line 302 (e.g., denoted as blrt) represents a true value, and bit-line 304 (e.g., denoted as blrc) represents the complement of the respective true value.

For this example, cell 300 includes two transistors 306 and 308. For many CAM applications, MOS transistors can be used for transistors 306 and 308. Also, depending on the applications and polarity of the supply desired, cell 300 can be implemented with n-channel MOS (NMOS) or p-channel MOS (PMOS) transistors. As shown, word-line 322 is connected to the gate of transistor 306 via pin 310 (bits_0), although word-line 322 may alternatively be connected to the gate of transistor 308 via pin 312 (bits_1). Word-line 322 may be connected to pin 310 or 312 as necessary to provide the appropriate address value and complement address value.

In the depicted example, true value bit-line (blrt) 302 is connected to the drain of transistor 306, and complement value bit-line (blrc) 304 is connected to the drain of transistor 308. Thus, with an entry input at word-line (wl) 322, transistor 306 is turned "on", and a bit is stored and placed on true bit-line (blrt) 302 by current flow via transistor 306. The complement of that bit is stored and placed on complementary bit-line (blrc) 304 by current flow via transistor 308. So, if a value of "1" is present at true bit-line (blrt) 302, then a value of "0" is present at complementary bit-line (blrc) 304, and vice versa when the gate ties are reversed. For example, to store a value of "1" in cell 300, bits_0 is tied to ground and bits_1 is tied to word-line (wl) 322. The true value is output on true bit-line (blrt) 302 and the complement of that bit is stored and placed on complementary bit-line (blrc) 304. Alternatively, to store a value of "0" in cell 300, bits_0 is tied to word-line (wl) 322 and bits_1 tied to ground. It must be noted that the transistor gate that is tied to ground is not needed to implement the present invention. However, using this particular implementation allows the same cell to be used for convenience.

Also in accordance with the present invention, if each true address bit (e.g., blrt 302) is XORed with its respective complement address bit (e.g., blrc 304), the result equals "1" for a single hit. However, if multiple entries are hit, for certain of the true address bits XORed with their respective complement address bits, their result(s) are not equal to "1". Thus, a multiple hit condition can be detected in this manner.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for detecting a multiple hit condition in a content addressable memory, comprising the stops of:
    storing a first address location value and a complement of maid first address location value for a first entry to the content addressable memory;
    storing an uth address location value and a complement of said nth address location value for an nth entry to the content addressable memory;
    performing a first OR operation for said first address location value and said nth address location value;
    performing a second OR operation for said complement of said first address location value and said complement of said nth address location value; and
    performing an XOR operation on a result of said first OR operation and a result of said second OR operation.

2. The method of claim 1, wherein the XOR operation comprises the step of detecting the multiple hit condition.

3. The method of claim 2, wherein the step of detecting the multiple hit condition comprises a step of determining whether or not a result of said XOR operation is a value equal to "0".

4. The method of claim 1, wherein said first entry comprises an entry "0", and said nth entry comprises an entry "7".

5. The method of claim 1, wherein said first address location value is present at a first bit-line of said content addressable memory, and said complement of said first address location value is present at a second bit-line of said content addressable memory.

6. The method of claim 1, wherein said nth address location value is present at a third bit-line of said content addressable memory, and said complement of said nth address location value is present at a fourth bit-line of said content addressable memory.

7. The method of claim 1, wherein said content addressable memory comprises an array.

8. A content addressable memory, comprising:
    means for storing a first address location value and a complement of said first address location value for a first entry to the content addressable memory;
    means for storing an nth address location value and a complement of said nth address location value for an nth entry to the content addressable memory;
    means for performing a first OR operation for said first address location value and said nth address location value;
    means for performing a second OR operation for said complement of said first address location value and said complement of said nth address location value; and
    means for performing an XOR operation on a result of said first OR operation and a result of said second OR operation.

9. The content addressable memory of claim 8, wherein said means for performing an XOR operation comprises means for detecting a multiple hit condition.

10. The content addressable memory of claim 9, wherein said means for detecting the multiple hit condition comprises means for determining whether or not a result of said XOR operation is a value equal to "0".

11. The content addressable memory of claim 8, wherein said first entry comprises an entry "0", and said nth entry comprises an entry "7".

12. The content addressable memory of claim 8, wherein said first address location value is present at a first bit-line of said content addressable memory, and said complement of said first address location value is present at a second bit-line of said content addressable memory.

13. The content addressable memory of claim 8, wherein said nth address location value is present at a third bit-line of said content addressable memory, and said complement of said nth address location value is present at a fourth bit-line of said content addressable memory.

14. The content addressable memory of claim 8, further comprising an array.

15. A content addressable memory, comprising:
    a plurality of address cells, said plurality of address cells arranged as an M by N array, whereby M represents a plurality of rows of said array, and N represents a plurality of columns of said array, said array including:
    means for storing an address location value and a complement of said address location value for each cell in said array;
    means for performing an OR operation for address location value in a column N of said array; and
    mean for performing a second OR operation for said complement of said address location values in said column N of said array; and
    means for performing an XOR operation on a result of said OR operationand result of said second OR operation.

16. A computer program product in a computer readable medium for detecting a multiple hit condition in a content addressable memory, the computer program product comprising:
    first instructions for storing a first address location value and a complement of said first address location value for a first entry to the content addressable memory;
    second instructions for storing an nth address location value and a complement of said nth address location value for an nth entry to the content addressable memory;
    third instructions for performing a first OR operation for said first address location value and said nth address location value;
    fourth instructions for performing a second OR operation for said complement of said first address location value and said complement of said nth address location value; and
    fifth instructions for performing an XOR operation on a result of said first OR operation and a result of said second OR operation.

17. The computer program product of claim 16, wherein the fifth instructions comprise instructions for detecting the multiple hit condition.

18. The computer program product of claim 17, wherein the fifth instructions for detecting the multiple hit condition comprises instructions for determining whether or not a result of said XOR operation is a value equal to "0".

19. The computer program product of claim 16, wherein said content addressable memory comprises an array.

20. A content addressable memory, comprising:
- a plurality of address cells, said plurality of address cells arranged as an M by N array, whereby M represents a plurality of rows of said array, and N represents a plurality of columns of said array, said array including:
- a storage device comprising an address location value and a complement of said address location value for each cell in said array;
- a logic device for performing a first OR operation for said address location values in said column N of said array;
- a logic device for performing a second OR operation for said address location values in said column N of said array; and
- a logic device for performing an XOR operation on a result of said first OR operation and a result of said second OR operation.

* * * * *